(12) United States Patent
Hori et al.

(10) Patent No.: US 9,320,129 B2
(45) Date of Patent: Apr. 19, 2016

(54) LIQUID-COOLED INTEGRATED SUBSTRATE AND MANUFACTURING METHOD OF LIQUID-COOLED INTEGRATED SUBSTRATE

(75) Inventors: Hisashi Hori, Shizuoka (JP); Takanori Kokubo, Shizuoka (JP); Hideyo Osanai, Tokyo (JP); Takayuki Takahashi, Tokyo (JP); Kunihiko Chihara, Tokyo (JP)

(73) Assignees: Dowa Metaltech Co., Ltd., Tokyo (JP); Nippon Light Metal Company, Ltd., Tokyo (JP)

( * ) Notice: Subject to any disclaimer, the term of this patent is extended or adjusted under 35 U.S.C. 154(b) by 100 days.

(21) Appl. No.: 13/521,928

(22) PCT Filed: Jan. 12, 2011

(86) PCT No.: PCT/JP2011/050380
§ 371 (c)(1),
(2), (4) Date: Jul. 12, 2012

(87) PCT Pub. No.: WO2011/087027
PCT Pub. Date: Jul. 21, 2011

(65) Prior Publication Data
US 2012/0305292 A1     Dec. 6, 2012

(30) Foreign Application Priority Data
Jan. 12, 2010 (JP) .................................. 2010-003631

(51) Int. Cl.
*H05K 1/00* (2006.01)
*H05K 1/02* (2006.01)
(Continued)

(52) U.S. Cl.
CPC .......... *H05K 1/0201* (2013.01); *H01L 23/3735* (2013.01); *H01L 23/473* (2013.01); *H01L 2924/0002* (2013.01); *H05K 1/0306* (2013.01); *H05K 3/0058* (2013.01)

(58) Field of Classification Search
CPC . H05K 1/0201; H05K 1/0203; H05K 1/0209; H05K 1/021; H05K 1/053; H05K 1/056; H05K 1/05; H05K 3/0058; H05K 3/0061
USPC .................. 174/252, 250, 251, 254–258, 260
See application file for complete search history.

(56) References Cited

U.S. PATENT DOCUMENTS 6,912,130 B2 * 6/2005 Osanai et al. ................. 361/699
2009/0065178 A1 * 3/2009 Kasezawa et al. ....... 165/104.19
(Continued)

FOREIGN PATENT DOCUMENTS

EP      2 259308 A1    12/2010
JP    2001-144224 A     5/2001
(Continued)

OTHER PUBLICATIONS

International Search Report issued in PCT/JP2011/050380, dated Mar. 8, 2011.
(Continued)

*Primary Examiner* — Tremesha S Willis
(74) *Attorney, Agent, or Firm* — Michael Best & Friedrich LLP

(57) ABSTRACT

There is provided a liquid-cooled integrated substrate 1 in which a metal circuit board 15 made of aluminum or an aluminum alloy is bonded to one surface of a ceramic substrate 10, one surface of a plate-like metal base plate 20 made of aluminum or an aluminum alloy is bonded to another surface of the ceramic substrate 10, and a liquid-cooling type radiator 30 composed of a porous pipe composed of an extrusion material is bonded to another flat surface of the metal base plate 20 by brazing, wherein a relation between a thickness t1 of the metal circuit board 15 and a thickness t2 of the metal base plate 20 satisfies t2/t1≥2 where the thickness t1 of the metal circuit board 15 is 0.4 to 3 mm and the thickness t2 of the metal base plate 20 is 0.8 to 6 mm.

8 Claims, 10 Drawing Sheets

(51) Int. Cl.
  H01L 23/373 (2006.01)
  H01L 23/473 (2006.01)
  H05K 1/03 (2006.01)
  H05K 3/00 (2006.01)

(56) References Cited

U.S. PATENT DOCUMENTS

| 2010/0206537 A1 | 8/2010 | Ikeda et al. |
| 2010/0258233 A1* | 10/2010 | Tonomura et al. ............. 156/64 |

FOREIGN PATENT DOCUMENTS

| JP | 2001-308232 A | 11/2001 |
| JP | 2006-240955 A | 9/2006 |
| JP | 2006-324647 A | 11/2006 |
| JP | 2007-067258 A | 3/2007 |
| JP | 2007-081201 A | 3/2007 |
| JP | 2008-117833 A | 5/2008 |
| JP | 2008-135757 A | 6/2008 |
| JP | 2008-218938 A | 9/2008 |
| JP | 2008-306107 A | 12/2008 |
| JP | 2009-026957 A | 2/2009 |
| JP | 2009-135392 A | 6/2009 |
| RU | 2282956 C1 | 8/2006 |
| WO | WO-2008/146646 A1 | 5/2008 |
| WO | WO-2009/116439 A1 | 9/2009 |

OTHER PUBLICATIONS

Office Action issued in Russian Patent Application No. 2012134381/07, mailed Jul. 9, 2014.
Office Action issued in Japanese Application No. 2011-004429, dated Nov. 25, 2014.
Office Action issued in Japanese Application No. 2011-004430, dated Nov. 25, 2014.
Communication from the European Patent Office dated May 28, 2015, for application No. 11733897.1.
Gillot, et al., "Double-Sided Cooling for High Power IGBT Modules Using Flip Chip Technology", IEEE Transactions on Components and Packaging Technologies, vol. 24, No. 4, Dec. 2001.
Office Action issued in Japanese Application No. 2011-004430, dated Jul. 21, 2015.

* cited by examiner though, in processing the fin shape, warpage may occur at the metal base plate due to the residual stress generated in the metal base plate during the processing. Furthermore, in the case of performing grooving processing to form a plurality of heat radiating fins, the strength as the whole metal-ceramic substrate (the whole integrated substrate) may become insufficient.

LIQUID-COOLED INTEGRATED SUBSTRATE AND MANUFACTURING METHOD OF LIQUID-COOLED INTEGRATED SUBSTRATE

TECHNICAL FIELD

The present invention relates to a metal-ceramic bonded substrate and, in particular, to a liquid-cooled integrated substrate in which a metal circuit board and a metal base plate each made of aluminum or an aluminum alloy are bonded to both surfaces of a ceramic substrate respectively, and a radiator is bonded to a surface of the metal base plate where the ceramic substrate is not bonded, and a manufacturing method thereof.

BACKGROUND ART

In a conventional power module used to control a large current, for example, in an electric vehicle, an electric train, a machine tool or the like, a metal-ceramic insulating substrate is fixed on one surface of a metal plate or a composite material called a base plate by soldering, and an electronic component such as a semiconductor chip is fixed on the metal-ceramic insulating substrate by soldering. Further, a radiator such as a heat radiating fin or a cooling jacket made of metal is attached to another surface (a rear surface) of the base plate via a heat conductive grease by screwing or the like.

Since the soldering of the base plate, the electronic component and so on to the metal-ceramic insulating substrate is performed by heating, warpage of the base plate is likely to occur due the difference in thermal expansion coefficient between bonded members in soldering. Further, the heat generated from the electronic component and so on is radiated to air, a cooling water or the like by the heat radiating fin or the cooling jacket (the radiator) via the metal-ceramic insulating substrate, the solder, and the base plate, so that if warpage of the base plate occurs, a clearance when the heat radiating fin or the cooling jacket is attached to the base plate increases to extremely decrease the heat radiation performance.

Hence, for example, Patent Document 1 discloses a metal-ceramic directly bonded substrate in which heat radiating fins (a reinforcing part) and a metal base plate are integrally formed and manufactured by a molten metal bonding method and the warpage of the base plate that is the above-described problem can be made extremely small. Further, for example, Patent Document 2 and Patent Document 3 disclose a cooling jacket attached to the metal base plate, the heat radiating fins or the like to efficiently cool the heat generator.

[Patent Document 1] Japanese Patent Application Laid-open No. 2008-218938
[Patent Document 2] Japanese Patent Application Laid-open No. 2006-324647
[Patent Document 3] Japanese Patent Application Laid-open No. 2008-135757

DISCLOSURE OF THE INVENTION

Problems to be Solved by the Invention

However, in the metal-ceramic substrate described in the above-described Patent Document 1, heat radiating fins are integrally provided on one surface of the metal base plate, as a mechanism performing heat radiation. In order to form the heat radiating fins integrally with the metal base plate made of aluminum or an aluminum alloy, it is necessary to process the fin shape using, for example, a mold, thus bringing about a problem of increased processing cost and material cost. Fur- In addition, in the metal-ceramic substrate described in the above-described Patent Document 1, sufficient transient heat conduction may not be ensured, and there is room for further improvement in the heat radiation performance (cooling efficiency).

Moreover, by attaching (bonding) the cooling jacket described in the above-described Patent Document 2 and Patent Document 3 to the metal-ceramic substrate, a metal-ceramic substrate (an integrated substrate) excellent in heat radiation performance (cooling efficiency) is obtained. However, since the metal-ceramic substrate described in the above-described Patent Document 2 and Patent Document 3 is configured such that the heat radiating fins are formed at the metal base plate and the cooling jacket is bonded to cover (to house) the heat radiating fins, the problems of the increased processing cost and material cost and the insufficient strength as the whole integrated substrate that are the above-described problems are considered to be unresolved. Furthermore, it is found that bonding the metal-ceramic substrate to a flat pipe in Patent Document 3 increased the warpage of the flat pipe and the metal circuit board of the metal-ceramic substrate to make it difficult to mount electronic components thereon, and brought about a problem with reliability when heat shock was applied.

Hence, in consideration of the above problems, an object of the present invention is to provide a liquid-cooled integrated substrate which has reduced material cost and processing cost, is reduced in warpage (shape deformation) as an integrated substrate, and has excellent strength and heat radiation performance, and a manufacturing method of the liquid-cooled integrated substrate.

Means for Solving the Problems

To achieve the above objects, according to the present invention, there is provided a liquid-cooled integrated substrate in which a metal circuit board made of aluminum or an aluminum alloy is bonded to one surface of a ceramic substrate, one surface of a plate-like metal base plate made of aluminum or an aluminum alloy is bonded to another surface of the ceramic substrate, and a liquid-cooling type radiator composed of an extrusion material is bonded to another surface of the metal base plate, wherein a relation between a thickness t1 of the metal circuit board and a thickness t2 of the metal base plate satisfies a following expression (1)

$$t2/t1 \geq 2 \quad (1)$$

where the thickness t1 of the metal circuit board is 0.4 to 3 mm and the thickness t2 of the metal base plate is 0.8 to 6 mm.

In the liquid-cooled integrated substrate, the radiator may be composed of a porous pipe, and the metal base plate and the radiator may be bonded together by brazing. It is preferable that a relation between a width W (mm) of a groove being a flow path for coolant of the porous pipe in the radiator and a depth D (mm) of the groove satisfies $$3.3W < D < 10W,$$

and it is preferable that a relation between the width W (mm) of the groove being the flow path for coolant of the porous pipe and a width T (mm) of a partition plate satisfies $-W+1.4<T/W<-1.5W+3.3$ (when $0.4 \leq W \leq 1.0$)

$-0.2W+0.7<T/W<-1.5W+3.3$ (when $1.0<W<2.0$).

Furthermore, it is preferable that the width W of the groove is 0.4 mm or more.

In the liquid-cooled integrated substrate, it is preferable that the radiator is made of aluminum or an aluminum alloy having a heat conductivity of 170 W/mK or more, it is preferable that the metal base plate is made of aluminum or an aluminum alloy having a heat conductivity of 170 W/mK or more, and it is preferable that the metal circuit board is made of aluminum or an aluminum alloy having a heat conductivity of 170 W/mK or more. When the metal base plate and the radiator are united into one body by the brazing method, it is necessary to suppress the additive amounts of elements to a degree not to inhibit the brazing performance. Hence, it is preferable that, for example, a Mg amount is 0.9 mass % or less. Further, the surface roughness of the metal circuit board is preferably an Ra of about 0.3 to 2.0 μm in order to improve the solder wettability for mounting components. Bonding of the ceramic substrate and the metal circuit board, bonding of the ceramic substrate and the metal base plate, and boding of the metal base plate and the radiator may be performed by a molten metal bonding method or a brazing method. The surface roughness of the metal base plate on the side where the radiator is bonded is preferably an Ra of 1.0 to 2.0 μm in order to improve the brazing performance. Note that when bonding the radiator and the metal base plate by the molten metal bonding method, the surface roughness may be an Ra of 0.3 to 2.0 μm. In the case of brazing, the surface roughness only needs to be a level obtained by a general extrusion material and plate material.

Further, a partition plate of the porous pipe may be buckled.

A manufacturing method of a liquid-cooled integrated substrate in which a metal circuit board made of aluminum or an aluminum alloy is bonded to one surface of a ceramic substrate, one surface of a plate-like metal base plate made of aluminum or an aluminum alloy is bonded to another surface of the ceramic substrate, and a liquid-cooling type radiator composed of an extrusion material is bonded to another surface of the metal base plate, wherein bonding of the metal circuit board and the ceramic substrate and bonding of the metal base plate and the ceramic substrate are performed by a molten metal bonding method, boding of the metal base plate and the radiator is performed by a brazing method, and a relation between a thickness t1 of the metal circuit board and a thickness t2 of the metal base plate satisfies a following expression (1)

$$t2/t1 \geq 2 \quad (1).$$

Further, in the manufacturing method of a liquid-cooled integrated substrate, it is preferable that the thickness t1 of the metal circuit board is 0.4 to 3 mm and the thickness t2 of the metal base plate is 0.8 to 6 mm.

The metal base plate and the radiator may be pressurized at a surface pressure equal to or more than an expression (2) and then heated to be bonded together by brazing, $$\text{surface pressure (N/mm}^2\text{)} = -1.25 \times 10^{-3} \times (\text{second moment of area of the radiator}) + 2.0 \quad (2).$$

In the manufacturing method of a liquid-cooled integrated substrate, it is preferable that the radiator is composed of a porous pipe and a relation between a width W (mm) of a groove being a flow path for coolant of the porous pipe and a depth D (mm) of the groove satisfies $3.3W<D<10W$, and it is preferable that a relation between the width W (mm) of the groove being the flow path for coolant of the porous pipe and a width T (mm) of a partition plate satisfies $-W+1.4<T/W<-1.5W+3.3$ (when $0.4 \leq W \leq 1.0$)

$-0.2W+0.7<T/W<-1.5W+3.3$ (when $1.0<W<2.0$).

Furthermore, it is preferable that the width W of the groove is 0.4 mm or more.

Moreover, it is preferable that the metal base plate and the radiator are pressurized such that a partition plate surface pressure applied on a partition plate of the porous pipe is equal to or less than $-0.5 \times D$ (depth of the groove) $+10$ (MPa), and then heated to be bonded together by brazing.

In the manufacturing method of a liquid-cooled integrated substrate, it is preferable that the radiator is made of aluminum or an aluminum alloy having a heat conductivity of 170 W/mK or more, it is preferable that the metal base plate is made of aluminum or an aluminum alloy having a heat conductivity of 170 W/mK or more, and it is preferable that the metal circuit board is made of aluminum or an aluminum alloy having a heat conductivity of 170 W/mK or more.

Effect of the Invention

According to the present invention, there is provide a liquid-cooled integrated substrate which has reduced material cost and processing cost, is reduced in warpage (shape deformation) as an integrated substrate, is excellent in reliability to heat shock, and has excellent strength and heat radiation performance, and a manufacturing method of the liquid-cooled integrated substrate.

BEST MODE FOR CARRYING OUT THE INVENTION

Figure 1:
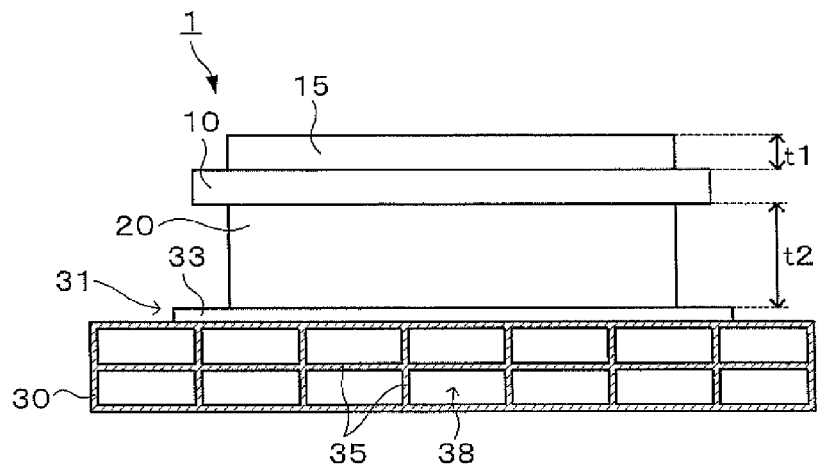
FIG. 1 A side sectional view of a liquid-cooled integrated substrate 1.

Hereinafter, an embodiment of the present invention will be described referring to the drawings. Note that the components having substantially the same functional configurations in the specification and drawings are given the same numerals to omit overlapped description.

FIG. 1 is a side section view of a liquid-cooled integrated substrate 1 according to an embodiment of the present invention. As illustrated in FIG. 1, in the liquid-cooled integrated substrate 1, a metal circuit board 15 made of aluminum or an aluminum alloy containing at least one element selected from among Si, Mg, Zn, Bi, and Sn is bonded to an upper surface (an upper part in FIG. 1) of a ceramic substrate 10 being, for example, an AlN substrate (an aluminum nitride substrate) or a SiN substrate (a silicon nitride substrate), and a metal base plate 20 made of aluminum or an aluminum alloy containing at least one element selected from among Si, Mg, Zn, Bi, and Sn is bonded to a lower surface (a lower part in FIG. 1) of the ceramic substrate 10. Further, a radiator 30 in a hollow square pillar shape composed of an extrusion material is bonded to a lower surface (a lower part in FIG. 1) of the metal base plate 20. The extrusion material here means a member to be integrally molded by the extrusion processing.

Note that in this embodiment, bonding of the ceramic substrate 10 and the metal circuit board 15 and bonding of the ceramic substrate 10 and the metal base plate 20 are performed by the molten metal bonding method, and bonding of the metal base plate 20 and the radiator 30 is performed by the brazing method. More specifically, in the bonding of the metal base plate 20 and the radiator 30, a brazing material layer 33 for the bonding is formed in a gap part 31 between them. When the brazing method is performed, a bonding object needs to have a thickness of a predetermined thickness or more (thickness enough to withstand the brazing). In this case, a sufficient thickness (for example, 0.5 mm or more) of, in particular, the upper surface (a bonding object surface) of the radiator 30 needs to be ensured.

Further, as illustrated in FIG. 1, the radiator 30 has a hollow inner space, and partition plates 35 partitioning the inner space are provided. In the radiator 30 according to this embodiment, the partition plates 35 are provided to partition the inner space into 14 parts as illustrated in the drawing, a plurality of (14) flow paths 38 are formed by the partition plates 35 in the inner space of the radiator 30. The radiator 30 provided with the partition plates 35 is produced as one unit body by the extrusion processing.

Figure 3:
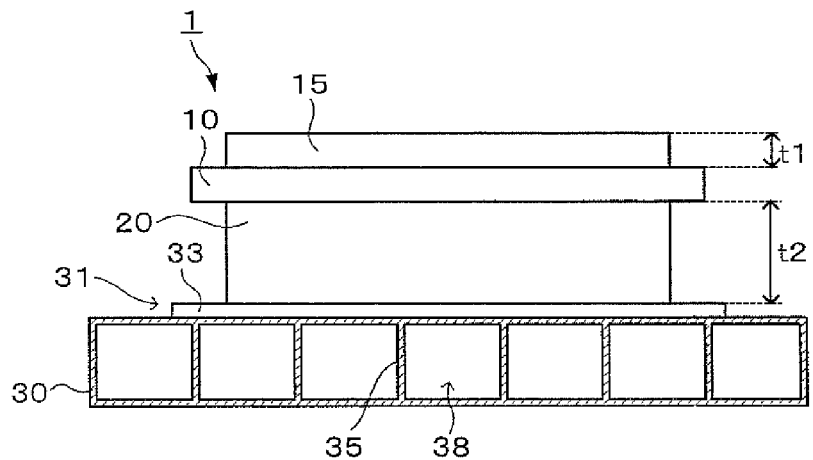
FIG. 3 A side sectional view of the liquid-cooled integrated substrate 1 when a radiator 30 has a different configuration.

FIG. 3 is a sectional view of a liquid-cooled integrated substrate 1 according to a modification example of the present invention in which the radiator 30 has a different configuration (a cross-sectional shape) in the liquid-cooled integrated substrate 1. In this modification example, the inner space of the radiator 30 is partitioned by the partition plates 35 into 7 flow paths 38 and configured such that the cooling liquid circulates in the flow paths 38 as in the above-described embodiment. The radiator 30 provided with the partition plates 35 is produced as one unit body by the extrusion processing.

Figure 2:
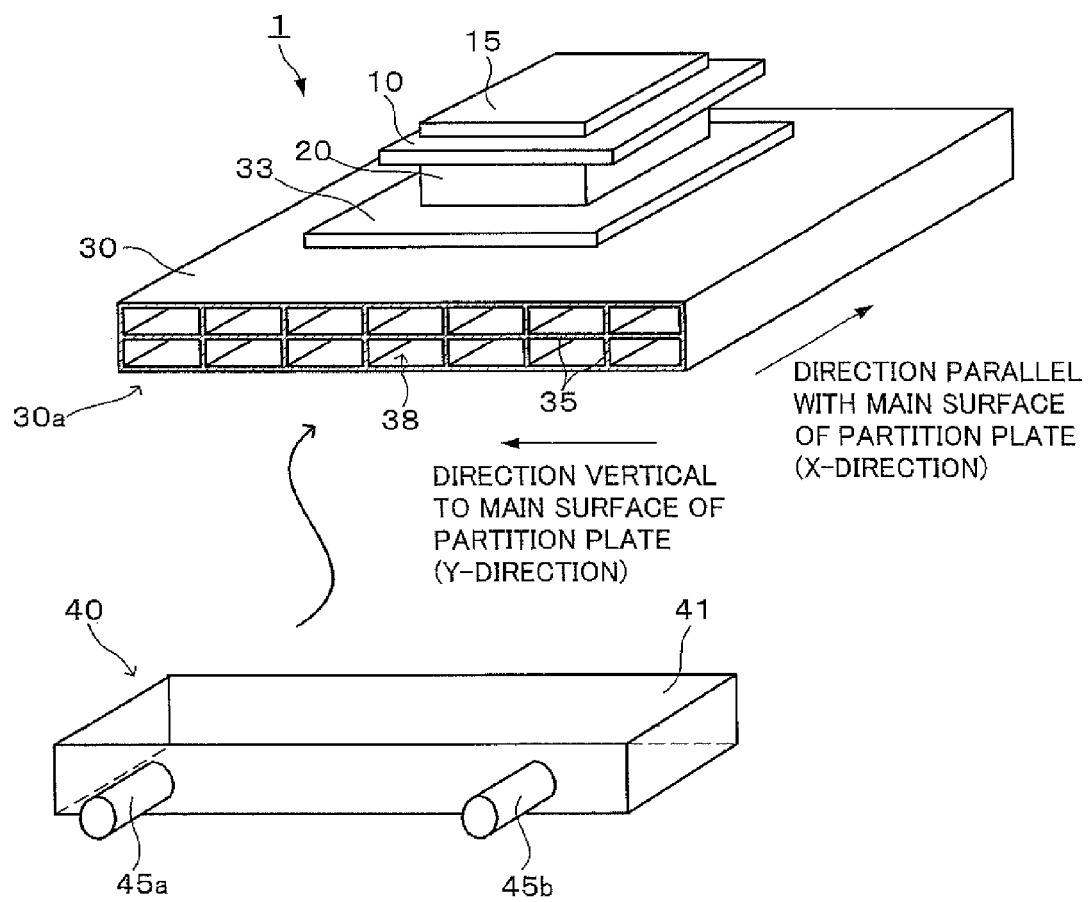
FIG. 2 A perspective view of the liquid-cooled integrated substrate 1 and a lid member 40.
Figure 4:
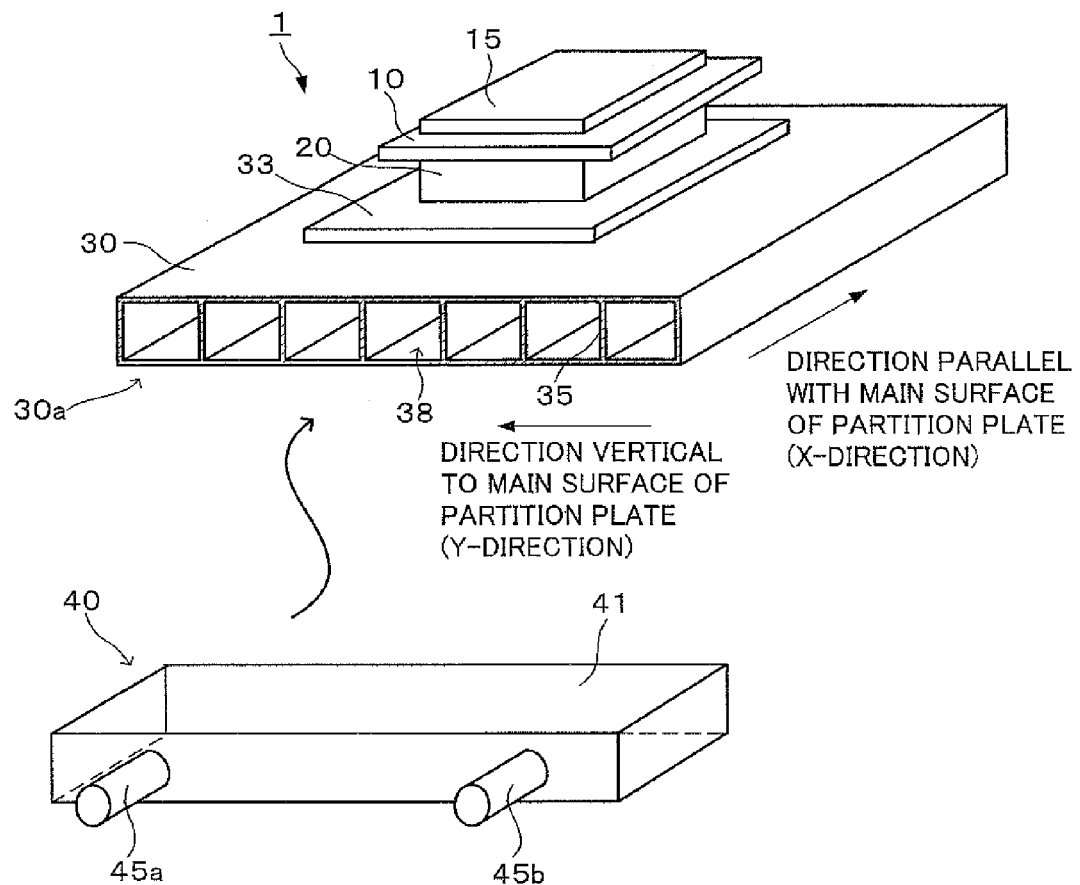
FIG. 4 A perspective view of the liquid-cooled integrated substrate 1 and the lid member 40 in FIG. 3.

Further, FIG. 2, FIG. 4 are perspective views of the liquid-cooled integrated substrate 1 and a lid member 40. The lid member 40 is a member to be attached in a manner to cover a side surface 30a of an opening on the front side (the front side in FIG. 2, FIG. 4) of the radiator 30. The lid member 40 is composed of a lid part 41 and liquid circulation ports 45 (45a, 45b) provided at two positions on a side surface of the lid part 41 (a surface corresponding to the side surface 30a when attached to the radiator 30). Further, in the radiator 30, at an opening provided on the opposite side to the opening on the front side in FIG. 2, FIG. 4, a not-illustrated lid member is attached that is similar except that it does not have the liquid circulation ports. The lid member 40 is actually attached to the radiator 30 when liquid cooling is actually performed because of heat generation of a semiconductor element or the like attached to the metal circuit board 15 in the liquid-cooled integrated substrate 1. A not-illustrated cooling liquid circulation mechanism is connected to the liquid circulation ports 45 (45a, 45b), and the cooling liquid is supplied from the cooling liquid circulation mechanism to the inside (the flow paths 38) of the radiator 30 via the liquid circulation port 45a and the cooling liquid is discharged from the inside of the radiator 30 via the liquid circulation port 45b to the cooling liquid circulation mechanism. In other words, the cooling liquid circulates between the inside of the radiator 30 and the cooling liquid circulation mechanism such that the cooling liquid flows into the flow paths 38 by the operation of the cooling liquid circulation mechanism and then returns again to the cooling liquid circulation mechanism, thereby keeping the cooling capacity of the radiator 30 constant. The lid member 40 and the radiator 30 may be subjected to brazing concurrently with the brazing of the metal base plate 20 and the radiator 30.

On the other hand, in liquid-cooled integrated substrate 1 according to this embodiment, the relation between a height t1 of the metal circuit board 15 and a height t2 of the metal base plate 20 is as in an expression (1) (see, for example, FIG. 1, FIG. 3).

$$t2/t1 \geq 2 \quad (1)$$

As respective values at this time, t1 is 0.4 to 3 mm and t2 is 0.8 to 6 mm. The reason why the relation between the height t1 of the metal circuit board 15 and the height t2 of the metal base plate 20 is desirably to be as in the above expression (1) is to obtain sufficient heat radiation performance of transient heat and to suppress warpage of the integrated substrate. Further, the reason why t1 is preferably 0.4 to 3 mm and t2 is desirably 0.8 to 6 mm is to obtain sufficient heat radiation performance of transient heat and to suppress warpage of the integrated substrate. Note that it is more preferable that t1 is 0.4 to 1.0 mm and t2 is 0.8 to 2 mm.

Further, the material of the radiator 30 is desirably aluminum or an aluminum alloy containing at least one element selected from among Si, Mg, Zn, Bi, and Sn having a heat conductivity of 170 W/mK or more.

Further, the surface roughness of the metal circuit board 15 is preferably an Ra of about 0.3 to 2.0 μm in order to improve the solder wettability for mounting components. The surface roughness of the radiator 30 only needs to be a level obtained by a general extrusion material and plate material. Further, the surface roughness of the metal base plate 20 on the side where the radiator 30 is bonded is preferably an Ra of 1.0 to 2.0 μm to improve the brazing performance. Note that when the radiator 30 and the metal base plate 20 are bonded together by the molten metal bonding method, an Ra of 0.3 to 2.0 μm is enough for the boding.

In the liquid-cooled integrated substrate 1 described above referring to FIG. 1 to FIG. 4, for example, when an electronic component such as a semiconductor element is attached to the metal circuit board 15 and used, the heat generated from the electronic component is radiated by the radiator 30 in which the cooling liquid circulates as described above, whereby the whole liquid-cooled integrated substrate 1 is cooled. Here, the liquid-cooled integrated substrate 1 exhibiting sufficient heat radiation performance is obtained because the relation between the height t1 of the metal circuit board 15 and the height t2 of the metal base plate 20 is as in the following expression (1), $$t2/t1 \geq 2 \quad (1)$$

and respective values are set such that t1 is 0.4 to 3 mm and t2 is 0.8 to 6 mm.

Further, the materials of the metal circuit board 15, the metal base plate 20 and the radiator 30 are aluminum or an aluminum alloy containing at least one element selected from among Si, Mg, Zn, Bi, and Sn having a heat conductivity of 170 W/mK or more, whereby the liquid-cooled integrated substrate 1 in which sufficient strength, reliability (heat shock resistance or the like) as the integrated substrate are ensured is obtained. Furthermore, sufficient bonding reliability is ensured by bonding the members together using the molten metal bonding method and the brazing method.

Further, the radiator 30 is composed of the extrusion material made of aluminum or an aluminum alloy having a heat conductivity of 170 W/mK or more, thereby enabling manufacture of the liquid-cooled integrated substrate 1 which has good heat radiation performance, has less occurrence of warpage (shape deformation) of the radiator 30 as compared to the case where the radiator 30 is subjected to machining such as cutting into the fin shape, and is excellent in material cost and processing cost because of the integral molding by the extrusion processing.

In the present invention, the metal base plate 20 and the radiator 30 are bonded together by the above-described brazing. The brazing is performed by setting a brazing material between the metal base plate 20 and the radiator 30, applying a predetermined load thereon, and heating it up to a predetermined brazing temperature in a brazing furnace. In the present invention, surface pressure=(load applied at setting before heating of brazing)/(area of the metal base plate), and the surface pressure is expressed in a following expression (2)

$$\text{surface pressure (N/mm}^2\text{)}=-1.25\times10^{-3}\times(\text{second moment of area of the radiator})+2.0 \quad (2).$$

Note that the second moment of area of the radiator 30 is calculated from the following expression.
In the case of the cross-section of the radiator vertical to the direction parallel with the partition plate, $$BH^3/12-((\text{groove width})\times\text{number of the grooves}\times D^3)/12, \text{ and}$$

in the case of the cross-section of the radiator vertical to the direction vertical to the partition plate, $$BH^3/12-(B\times D^3)/12,$$

where B: the width of a bonded part of the radiator and the metal base plate, H: the height of the radiator, D: the groove depth of a porous pipe in the radiator (height of the partition plate), T: the width of the partition plate.
By setting the surface pressure at the brazing is to the expression (2) or more with respect to the stiffness of the metal base plate 20, an integrated substrate in which the warpage amount is reduced can be obtained.

Further, the depth dimension D (mm) of each groove (the flow path 38 for the cooling liquid) of the radiator 30 with respect to the width dimension W (mm) of each groove falling within a range of $$3.3W<D<10W$$

balances the preferable thermal performance and extrusion performance. Further, the width W (mm) and the partition plate width T (mm) satisfying $$-W+1.4<T/W<-1.5W+3.3 \ (\text{when } 0.4\leq W\leq 1.0)$$

$$-0.2W+0.7<T/W<-1.5W+3.3 \ (\text{when } 1.0<W<2.0)$$

can balance the preferable thermal performance and extrusion performance.
Furthermore, surface pressure of the partition plate=(load applied to the radiator 30 at brazing)/(area of the partition plate of the radiator 30), and the surface pressure of the partition plate is set to equal to or less than −0.5×D (groove depth)+10 (MPa), whereby the buckling of the partition plate of the radiator can be reduced. However, the area of the partition plate means the cross-sectional area of the partition plate when the partition plate 35 is cut along the plane parallel with the upper plate.

An example of the embodiment of the present invention has been described above, but the present invention is not limited to the illustrated embodiment. It should be understood that various changes and modifications are readily apparent to those skilled in the art within the scope of the spirit as set forth in claims, and those should also be covered by the technical scope of the present invention.

For example, the configuration (cross-sectional shape) of the radiator 30 in the above embodiment is made such that the inner space of the radiator 30 is partitioned into 14 or 7 parts by the partition plates 35 in the above-described embodiment, but the way of partitioning and the number of the flow paths 38 to be formed can be arbitrarily set, and are preferably determined so that the heat radiation performance (cooling efficiency) of the radiator 30 is preferable.

EXAMPLES

Example 1

Liquid-cooled integrated substrates were produced according to the present invention, and the products were evaluated.

First, an AlN substrate was prepared as the ceramic substrate 10, and the metal circuit board 15 was bonded to one surface thereof and the metal base plate 20 was bonded to another surface thereof by the molten metal bonding to obtain a metal-ceramic bonded substrate ("Alumic" (registered trademark) substrate). The sizes of the ceramic substrate 10, the metal circuit board 15 and the metal base plate 20 are as presented in Table 1, and samples of the present invention examples 1, 2, 3 based on the present invention and comparative examples 1, 2 were produced. The materials of the metal circuit board and the metal base plate were 0.4 mass % Si-0.04 mass % B-balance Al. The metal circuit board 15 and the metal base plate 20 were bonded to the middle of the ceramic substrate 10 respectively. Note that the parts outside the range of the present invention in the comparative examples 1, 2 are underlined.

[Table 1]

Next, a porous pipe composed of an aluminum extrusion material was prepared as the radiator 30, and four metal-ceramic bonded substrates presented in Table 1 were bonded to every one radiator via the brazing material to produce a liquid-cooled integrated substrate. The outer dimensions of the radiator 30 were 122 mm×90 mm×8 mm, the thickness of each of the upper plate and the lower plate was 1 mm, and the flow path 38 was structured such that the height (height of the partition plate) of 6 mm, the width of 1.5 mm, and the rib width (partition plate width) of 0.7 mm continued. The four metal-ceramic bonded substrates were bonded to the middle portion at a position where the upper surface (the top plate) of the radiator 30 was divided in quarters. Further, the brazing of the metal base plate 20 and the radiator 30 was performed by keeping at 600□×10 minutes in a vacuum using a brazing material of A4045.

The evaluation of the liquid-cooled integrated substrate was performed about cracks in the solder and at the bonding interfaces, a heat shock test, and the warped shape of the upper surface of the radiator.

The cracks in the solder and at the bonding interfaces were searched by an ultrasonic flaw detector. Note that the sample of the solder crack was evaluated with a semiconductor chip bonded on the metal circuit board of the liquid-cooled integrated substrate via an eutectic solder. The heat shock test was carried out using a liquid tank type heat shock tester by repeating a process of keeping −40□ for 2 minutes and then keeping at 110□ for 2 minutes as one cycle. The solder crack was evaluated by obtaining an area ratio of the solder crack by the ultrasonic flaw detector at the initial stage, after 1000 cycles, after 2500 cycles, and after 4000 cycles. For the crack at the bonding interface, the length at the farthest position of the crack extending in the bonding interface direction from the metal base plate edge face of the metal-ceramic bonded substrate after 4000 cycles of heat shock was evaluated by the ultrasonic flaw detector. Note that the length of the crack was confirmed also by monitoring the cross-section of the sample. The warped shape (warpage amount) of the porous pipe was regarded as the difference in height between the middle portion and the end portion of the porous pipe, and measured using a three-dimensional warpage measurement device after bonding, after soldering, and after 4000 cycles of heat shock, and the difference in warpage between after bonding and after 4000 cycles was obtained. The evaluation result of a sample in which the crack most developed among the four metal-ceramic bonded substrates bonded to the radiators was presented in Table 2. Note that in the results of the comparative examples 1, 2, the parts where the characteristics are inferior to those of the present invention examples 1, 2, 3 produced according to the present invention are underlined.

[Table 2]

In the comparative examples where a ratio t1/t2 between the height t1 of the metal circuit board and the height t2 of the metal base plate was smaller than the range of the present invention were susceptible to heat shock and had many cracks occurred.

Example 2

A basic test for producing a liquid-cooled integrated substrate by brazing was carried out using a heat radiating substrate "Alumic" (registered trademark) in which an aluminum alloy was molten metal-bonded (directly bonded) to both surfaces of the AlN substrate.

Figure 5:
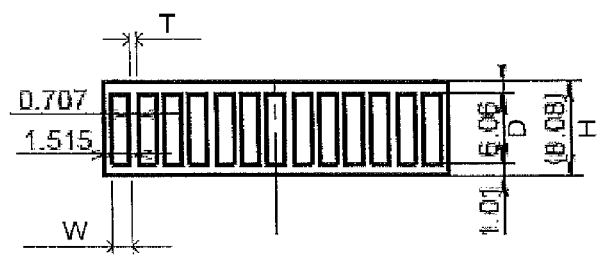
FIG. 5 A sectional view illustrating a porous pipe used in examples.

First, three kinds of radiators composed of a plate material of 40 mm long×40 mm wide×4 mm thick, a plate material of 40 mm long×40 mm wide×6 mm thick, and a plate material of 40 mm long×40 mm wide×8 mm thick each of which is a material with an alloy number of A1100 material (pure aluminum), and a radiator composed of a porous pipe (material: made of an aluminum alloy with an alloy number of A6063) of 40 mm long×40 mm wide×8.08 mm thick illustrated in FIG. 5 were prepared. In the radiator composed of a porous pipe, many flow paths for coolant were successively arranged side by side as illustrated in FIG. 5, and the width W of the groove being the flow path for coolant (width of the pipe) was 1.515 mm, the depth D of the groove (height of the pipe) was 6.06 mm, the width of the partition plate (rib thickness, heat radiating fin thickness) was 0.707 mm, and the thickness of each of the upper plate (the top plate) and the lower plate (the bottom plate) was 1.01 mm.

Further, as a small heat radiating substrate, a metal circuit board made of an aluminum alloy with dimensions of 15.7 mm long×26.4 mm wide×0.6 mm thick (t1), a ceramic substrate with dimensions of 18.1 mm long×28.8 mm wide×0.64 mm thick, and a metal base plate 20 made of an aluminum alloy with dimensions of 15.7 mm long×26.4 mm wide×1.6 mm thick (t2) was prepared. Further, a small heat radiating substrate having the same configuration except that the thickness (t2) of the metal base plate 20 was 0.6 mm was prepared. The materials of the metal circuit board and the metal base plate were 0.4 mass % Si-0.04 mass % B-balance Al. Note that both of the metal circuit board and the metal base plate of the small heat radiating substrate were a rectangular parallelepiped (a plate shape) and were placed and bonded at the middle of the ceramic substrate.

Figure 6:
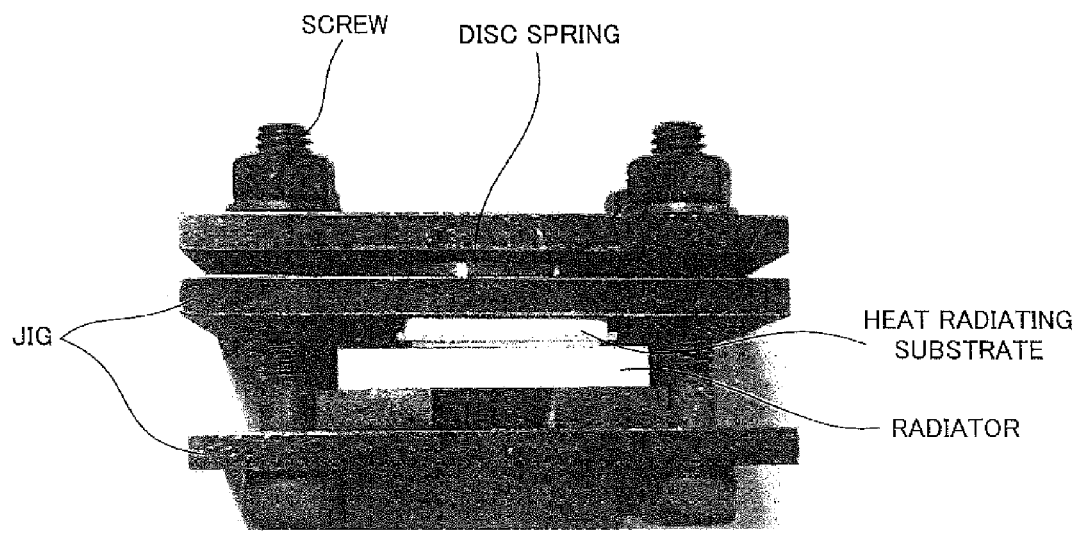
FIG. 6 A photograph of a brazing jig used in the examples as seen from the front side.

As shown in FIG. 6, a brazing material (composition: 10 mass % Si-1 mass % Mg-balance Al, 15 μm thick) having the same size (length and width) as that of the aluminum part of the metal base plate of the small heat radiating substrate was set on the radiator, the heat radiating substrate was placed on the brazing material, and a disc spring of "Inconel" (registered trademark) was placed thereon via a jig and fastened with bolts so that a predetermined load (surface pressure) was applied thereon. Then, it was set in a brazing furnace in a nitrogen atmosphere, and then increased in temperature at 50 □/min up to 500□ and 10 □/min up to 605□, and kept at 605□ being the brazing temperature for 10 minutes, and then cooled at 15 □/min down to 250□. After the brazing in this manner, the warpage amount (in a 26.4 mm longitudinal direction) of the surface of the metal circuit board of the heat radiating substrate was measured. The result is presented in Table 1. Note that as the warpage amount, the difference in height between the end portion and the middle portion of the metal circuit board was measured by a three-dimensional surface roughness tester.

[Table 3]

Figure 7:
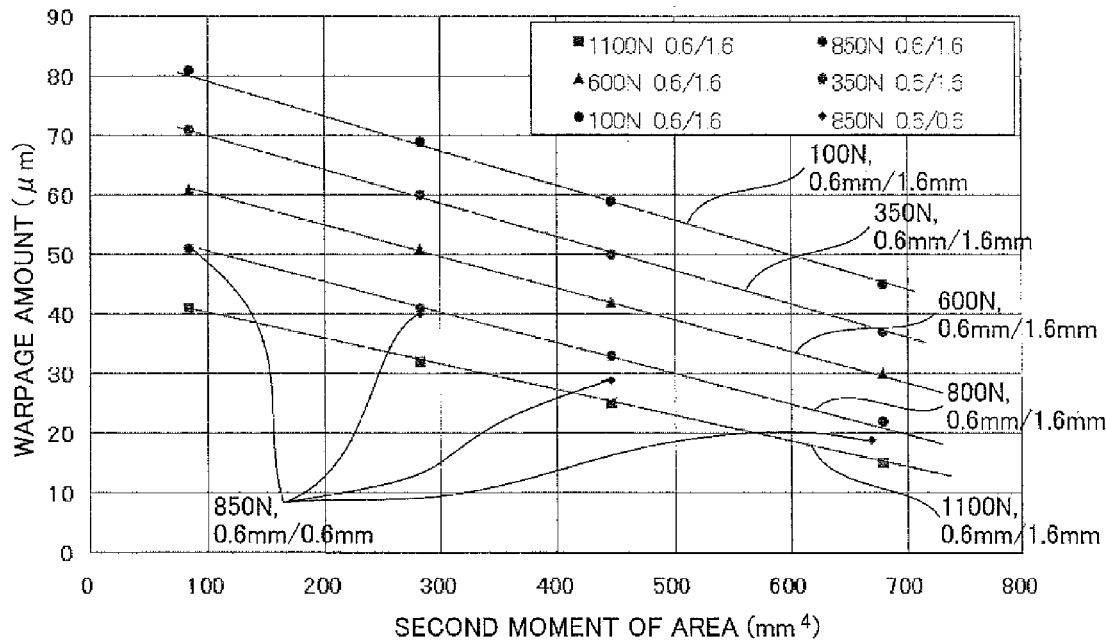
FIG. 7 A graph showing the relation between the second moment of area and the warpage amount of an aluminum material by a brazing test carried out in an example 2.
Figure 8:
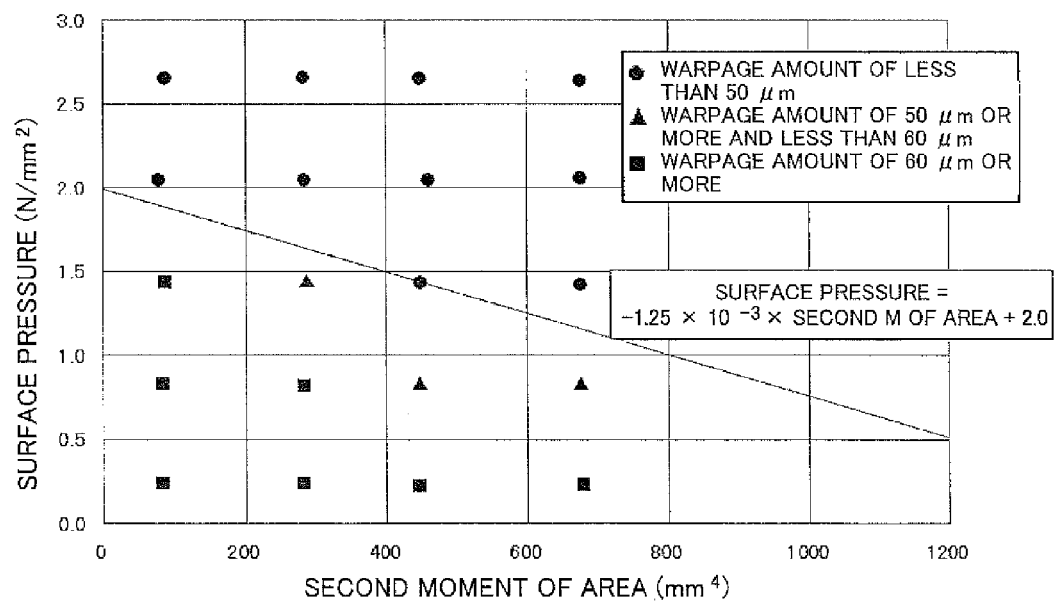
FIG. 8 A graph showing the relation between the second moment of area and the surface pressure and the warpage amount of the aluminum material obtained in the example 2.

As is clear from Table 3, as the surface pressure increases and as the second moment of area of the radiator (the aluminum material) increases, the warpage amount of the surface of the heat radiating substrate decreases. Further, as illustrated in FIG. 7, it was found that there was a good correlation between the warpage amount and the second moment of area of the radiator (the aluminum material). Since there was no difference in the warpage amount even when the thickness of the metal base plate of the heat radiating substrate was changed, it is conceivable that the thickness of the metal base plate of the heat radiating substrate does not affect the warpage. However, considering the heat radiation performance such as the transient heat characteristics and reliability, it is preferable that the thickness of the metal base plate is larger. When the warpage is large, a failure occurs when a semiconductor chip is bonded to the surface of the metal circuit board by soldering. Therefore, the target warpage amount is 60 μm or less, and desirably 50 μm or less. It was found that there were ranges of the surface pressure and the second moment of area to bring the warpage amount to 60 μm or less or 50 μm or less as illustrated in FIG. 8. More specifically, $$\text{surface pressure (N/mm}^2\text{)}=-1.25\times10^{-3}\times(\text{second moment of area of the radiator})+2.0 \quad (2).$$

When the target of the warpage amount is 50 μm, the target can be achieved by satisfying the expression (2).

Example 3

Figure 9:
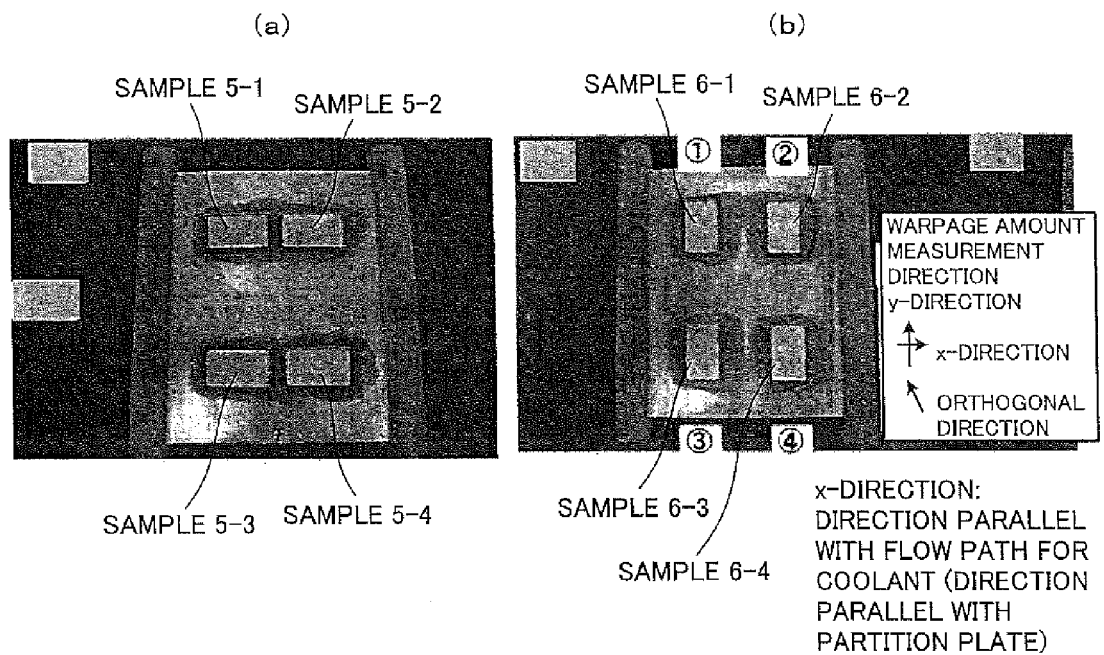
FIG. 9 Photographs showing the appearances after the brazing of the brazing test carried out in an example 3, (a) being a type in which samples were brazed such that their longitudinal direction was along a direction parallel with the partition plate of the porous pipe (an X-direction), and (b) being a type in which samples were brazed such that their longitudinal direction was along a direction vertical to the partition plate of the porous pipe (a Y-direction).

A radiator is composed of a porous pipe in which many flow paths for coolant were successively arranged side by side as illustrated in FIG. 5, and the width W of the groove being the flow path for coolant (width of the pipe) was 1.515 mm, the depth D of the groove (height of the pipe) was 6.06 mm, the width of the partition plate (rib thickness, heat radiating fin thickness) T was 0.707 mm, and the thickness of each of the top plate and the bottom plate was 1.01 mm, the porous pipe being cut into 110 mm (in an extrusion direction)×135 mm, and pipes of φ18 mm (an inner diameter of 16 mm) were brazed as a lid material on both sides thereof. By a not-illustrated cooling solution circulation mechanism, the coolant is supplied from one of the pipes, passes through the porous pipe, and is discharged from the other pipe. Further, on the surface of the porous pipe, four small heat radiating substrates (a metal circuit board made of an aluminum alloy of 15.7 mm×26.4 mm×0.6 mm, a meal base plate made of an aluminum alloy of 15.7 mm×26.4 mm×0.6 mm, a ceramic (an AlN substrate) of 18.1 mm×28.8 mm×0.64 mm) were brazed. The materials of the metal circuit board 15 and the metal base plate 20 were 0.4 mass % Si-0.04 mass % B-balance Al. The load in this event was 3500 N, namely, the surface pressure was 2.1 N/mm². The brazing conditions were the same as those in the example 2, but flux was applied for the brazing of the porous pipe and the pipes. The porous pipe and the small heat radiating substrates, and the porous pipe and the pipes were simultaneously bonded. A type in which the small heat radiating substrates (5-1, 5-2, 5-3, 5-4) were brazed such that their longitudinal direction was along a direction parallel with the partition plate of the porous pipe (a direction of the flow paths for coolant) as illustrated in FIG. 9(a) (called a parallel type), and a type in which the small heat radiating substrates (6-1, 6-2, 6-3, 6-4) were brazed such that their longitudinal direction was along a direction vertical to the partition plate of the porous pipe (a direction at right angle to the flow paths for coolant) as illustrated in FIG. 9(b) (called a vertical type) were experimentally produced. The measurement results of the warpage amounts on the surfaces of the metal circuit boards are presented in FIG. 10. The warpage amount was measured as the difference in height between the end portion and the middle portion of the metal circuit board for each case on the surface of the metal circuit board in an X-direction (the direction parallel with the partition plate), the surface of the metal circuit board in a Y-direction (the direction vertical to the partition plate), the surface of the metal circuit board in an oblique direction (a diagonal direction of the metal circuit board) by a three-dimensional surface roughness tester.

Figure 10:
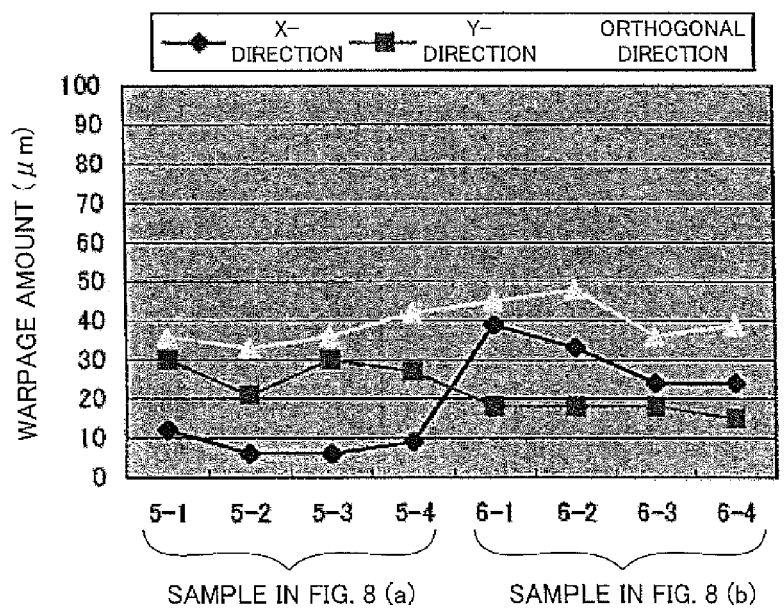
FIG. 10 A graph showing the warpage amount by a test in the example 3.

As is clear from FIG. 10, by setting the surface pressure based on the expression (2) obtained in the example 2, the target warpage amount of 50 μm or less was able to be achieved even when the four small heat radiating substrates were brazed.

Figure 11:
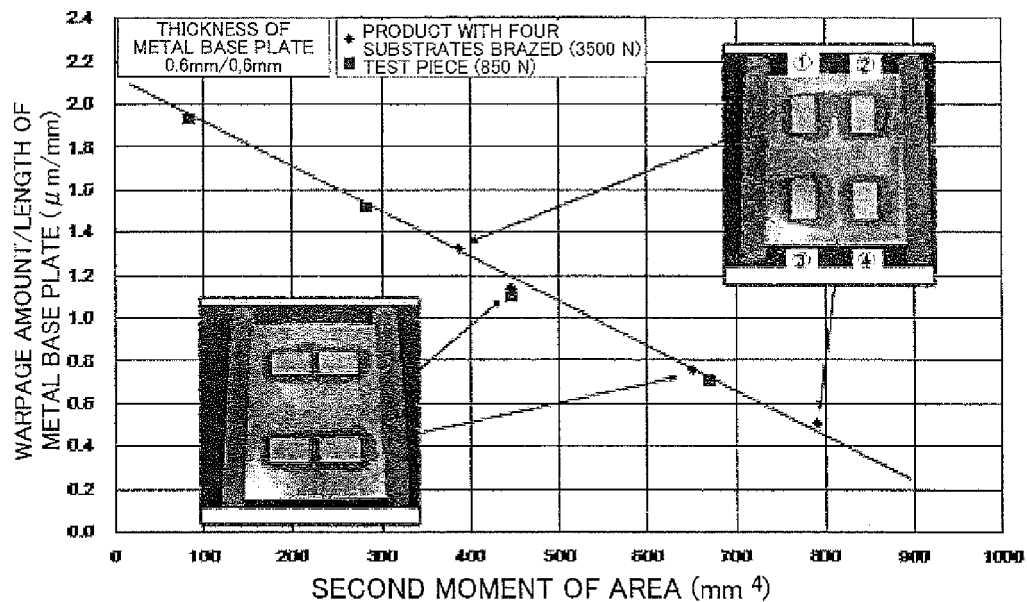
FIG. 11 A graph of the test result in the example 3 and showing the relation between the second moment of area and the warpage amount depending on the brazing direction of a small heat radiating substrate (a sample).

Further, since the second moment of area changes depending on the direction of the partition plate, the warpage amount also changes as illustrated in FIG. 10. Hence, the results obtained by calculating the second moments of area in the X-direction and in the Y-direction and calculating the warpage amounts per unit length are presented in FIG. 11. It was found that as presented in FIG. 11, even when the second moment of area changed because the direction of the partition plate differed, the warpage amount ranged on the same line, and that the second moment of area was the reasonable factor affecting the warpage amount.

Example 4

Next, two kinds of radiators composed of a plate material of 40 mm long×40 mm wide×4 mm thick and a plate material of 40 mm long×40 mm wide×8 mm thick each of which is a material of A1100 material, and a radiator composed of a porous pipe (material: made of an A6063 alloy) of 40 mm long×40 mm wide×8.08 mm illustrated in FIG. 5 were prepared. In the radiator composed of the porous pipe, many flow paths for coolant were successively arranged side by side as illustrated in FIG. 5, and the width W of the groove being the flow path for coolant (width of the pipe) was 1.515 mm, the depth D of the groove (height of the pipe) was 6.06 mm, the width of the partition plate (heat radiating fin thickness, rib thickness) was 0.707 mm, and the thickness of each of the top plate and the bottom plate was 1.01 mm.

Further, as the heat radiating substrate (Alumic), a large heat radiating substrate composed of a metal circuit board made of an aluminum alloy with dimensions of 27.4 mm long×32.4 mm wide×0.6 mm thick (t1), a ceramic substrate with dimensions of 28.8 mm×38.8 mm×0.64 mm, and a metal base plate 20 made of an aluminum alloy with dimensions of 27.4 mm long×32.4 mm wide×1.6 mm thick (t2) was prepared. The materials of the metal circuit board 15 and the metal base plate 20 were 0.4 mass % Si-0.04 mass % B-balance Al.

As shown in FIG. 6, a brazing material (composition: 10 mass % Si-1 mass % Mg-balance Al, 15 μm thick) having the same size (length and width) as that of the aluminum part of the metal base plate of the heat radiating substrate was set on the radiator, and the heat radiating substrate was placed on the brazing material and brazed. The brazing conditions were the same as those in the example 2 except the surface pressure. The warpage amount (in a 32.4 mm direction) of the surface of the metal circuit board of the large heat radiating substrate obtained in this event was measured as in the example 2. Note that the test was carried out with the load at brazing set to two kinds of 1150 N (a surface pressure of 1.31 N/mm$^2$) and 1600 N (a surface pressure of 1.82 N/mm$^2$).

Figure 12:
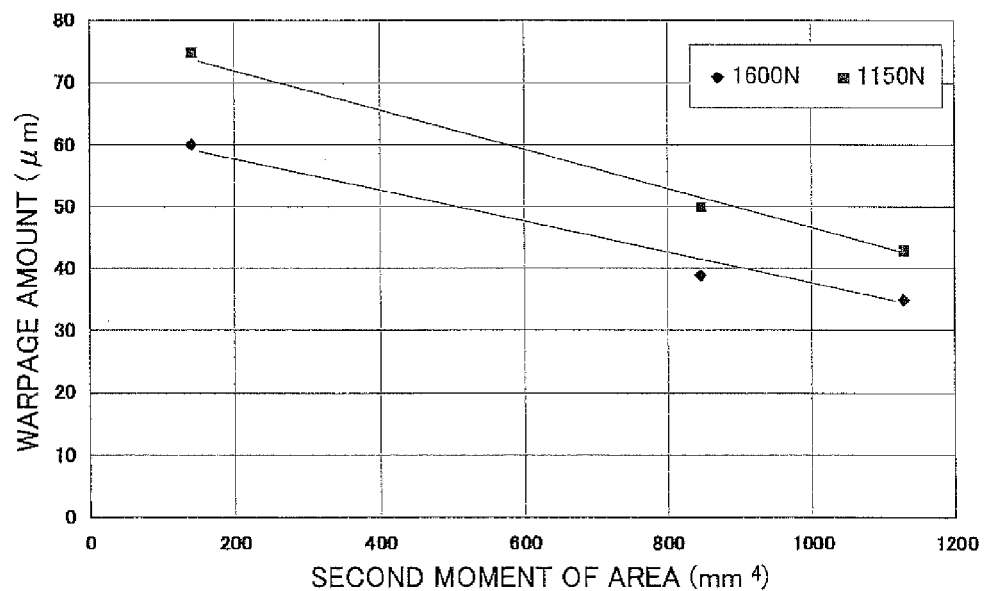
FIG. 12 A graph showing the relation between the second moment of area and the warpage amount of the brazing test of a large heat radiating substrate carried out in an example 4.
Figure 13:
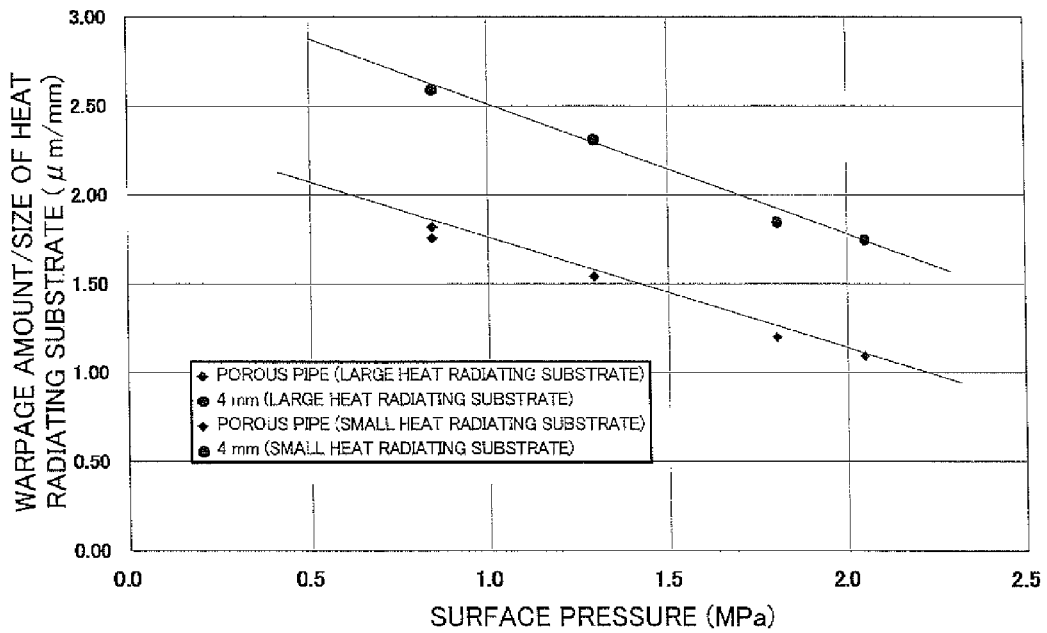
FIG. 13 A graph of comparison of the warpage amounts per unit length with respect to the surface pressures of the large heat radiating substrate and the small heat radiating substrate carried out in the example 4.

It was found that even in the case of the large heat radiating substrate, an excellent correlation was exhibited between the second moment of area and the warpage amount as illustrated in FIG. 12. Further, the relations between the surface pressure and the warpage amount when the small heat radiating substrate and the large heat radiating substrate were brazed to the radiator composed of an aluminum plate with a thickness of 4 mm and the radiator composed of the porous pipe are presented in FIG. 13. Since the sizes of the heat radiating substrates were different, a value obtained by dividing the warpage amount by the size of the heat radiating substrate was used as the warpage amount. As is obvious from FIG. 13, in the case of the radiator composed of the porous pipe, that the warpage amount (warpage amount/size of the heat radiating substrate) exhibited a good correlation with respect to the surface pressure and was not affected by the size of the heat radiating substrate. The same result was obtained also in the radiator composed of the aluminum plate with a thickness of 4 mm. It was found from the above results that the expression (2) was applicable even if the size of the heat radiating substrate was different.

Figure 14:
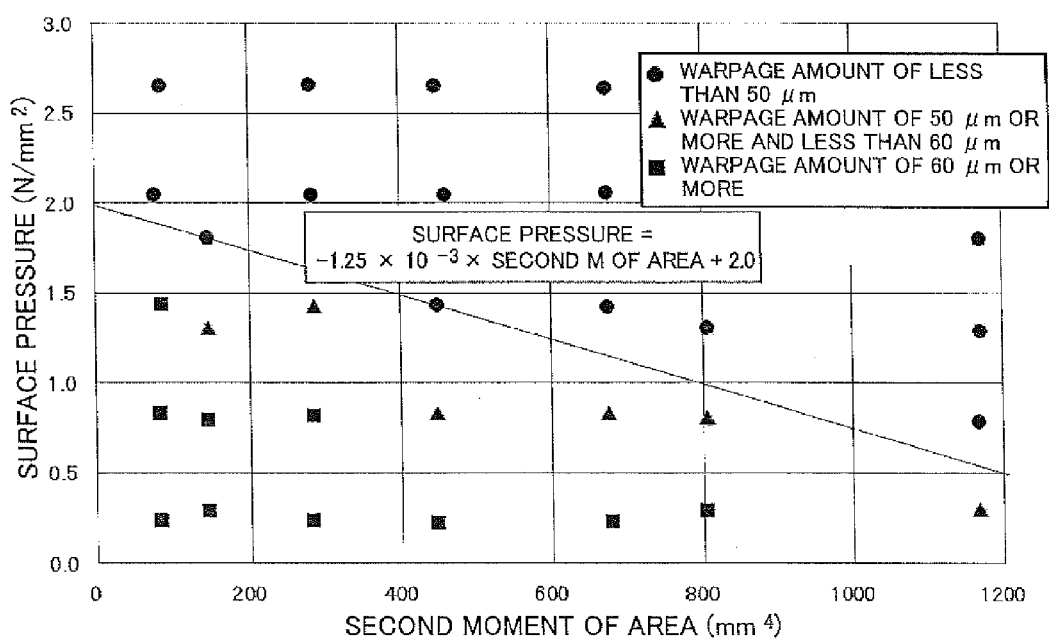
FIG. 14 A graph showing the relation between the second moment of area and the surface pressure and the warpage amount of the aluminum material obtained in the example 4.

A result obtained by combining the result of the large heat radiating substrate to FIG. 8 being the result of the small heat radiating substrate is presented in FIG. 14. Note that the warpage amount of the large heat radiating substrate was corrected to the warpage amount of the small heat radiating substrate. More specifically, a value obtained by dividing the warpage amount of the large heat radiating substrate by 1.18 (32.4/27.4) was evaluated. As illustrated in FIG. 14, the result of the large heat radiating substrate substantially coincided with the result of the small heat radiating substrate. In short, it was found that the expression (2) was applicable even when the size of the heat radiating substrate changed.

It was found from the above result that it was necessary to satisfy the expression (2) in order to bring the warpage amount of the high heat radiating substrate to 50 μm or less.

Example 5

The thermal analysis was carried out with the size of the radiator set to 50 mm×70 mm and the groove width W, the groove depth D, and the partition plate width T (see FIG. 5) of the porous pipe used as the radiator changed, to obtain preferable relations between the groove width W and the groove depth D and between the groove width W and a partition plate width T/groove width W ratio. Further, the extrusion limit in manufacture of the porous pipe was obtained.

Figure 15:
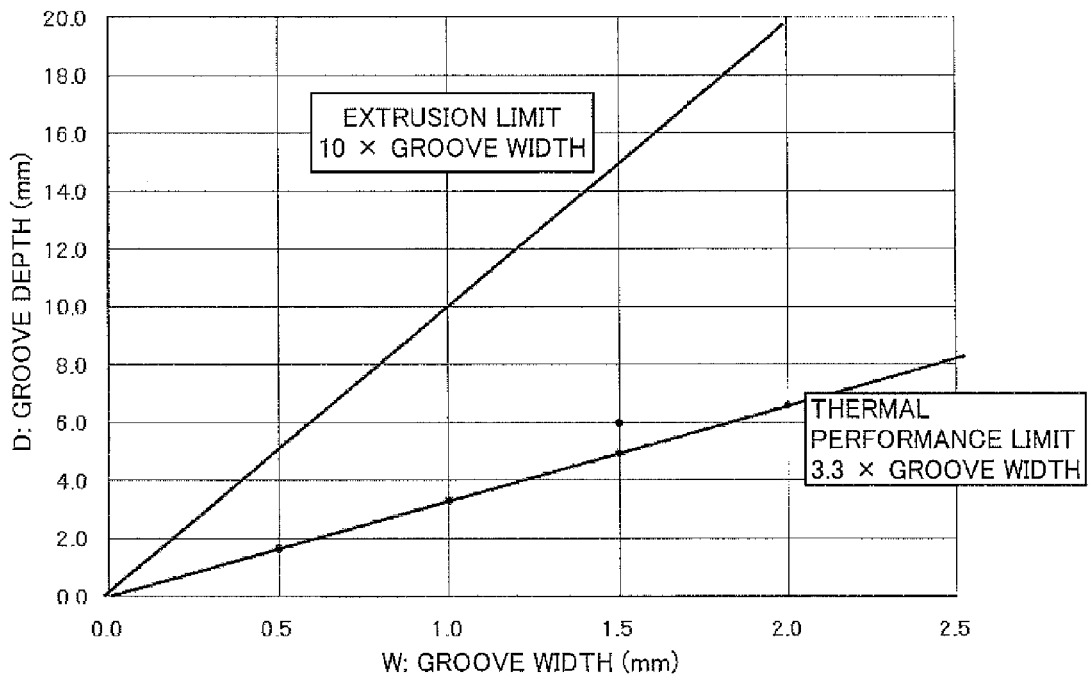
FIG. 15 A graph showing the relation between the groove width and the groove depth and the performance obtained in an example 5.
Figure 16:
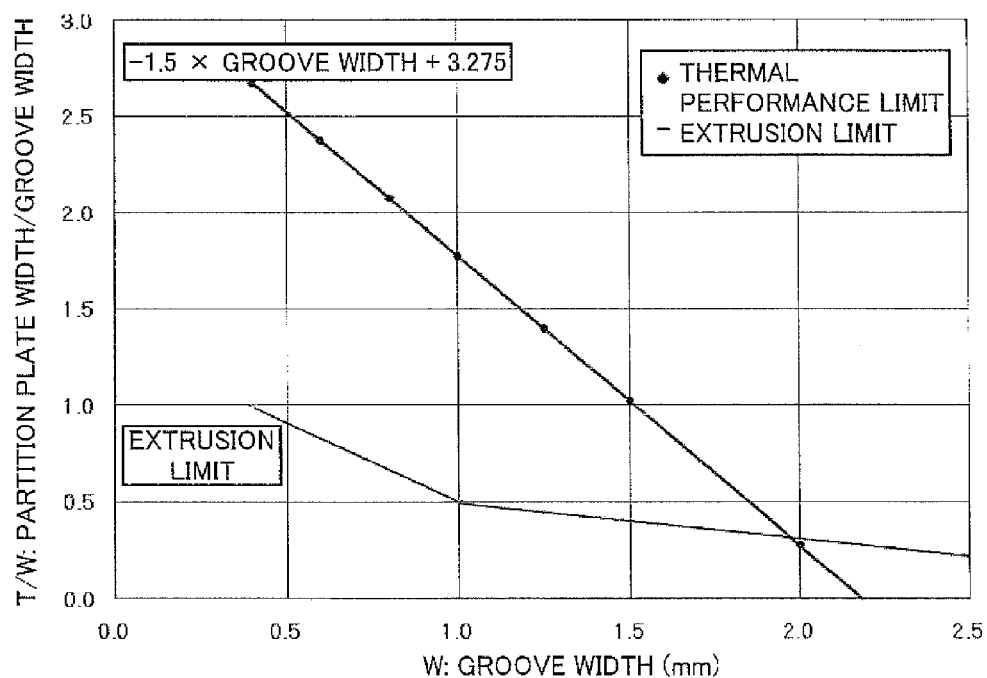
FIG. 16 A graph showing the relation between the groove width and the partition plate width (heat radiating fin width)/ the groove depth and the performance obtained in the example 5.

The relation between the groove width W and the groove depth D is presented in FIG. 15. As illustrated in FIG. 15, $$D=3.3W$$

is the lower limit when the thermal performance is preferable, and below this value (when D is smaller than 3.3 W), the thermal performance decreases. Further, $$D=10W$$

is the upper limit that is the extrusion processing limit, and over this value, namely, when D is larger than 10 W, the extrusion is impossible. Furthermore, the relation between the groove width W and the partition plate width T/groove width W ratio is presented in FIG. 16. As presented in FIG. 16, the lower limit expressed by $$-W+1.4=T/W \text{ (when } 0.4 \leq W \leq 1.0)$$

$$-0.2W+0.7=T/W \text{ (when } 1.0<W<2.0)$$

is the limit of the extrusion processing, and the upper limit expressed by $$T/W=-1.5W+3.275$$

is the limit where the thermal performance is preferable, and over this value, the thermal performance decreases. It was found that there were restrictions in dimensions of the groove width W, the groove depth D, and the partition plate width T from the thermal performance and the extrusion limit as illustrated in FIG. 15 and FIG. 16. Note that the lower limit where the thermal performance is preferable is set in consideration of the heat radiation performance when a power semiconductor chip such as an IGBT is mounted on the metal circuit board.

In the case of the porous pipe as illustrated in FIG. 5, the load applied on the heat radiating substrate is applied on the partition plate (the rib, the heat radiating fin). Radiators composed of heat radiating substrates composed of a metal circuit board and a metal base plate each made of an aluminum alloy with dimensions of 15.7 mm long×26.4 mm wide and a ceramic substrate with dimensions of 18.1 mm long×28.8 mm wide×0.64 mm thick, and the thickness t1 of the metal circuit board 15 and the thickness t2 of the metal base plate 20 made of the aluminum alloy being 0.6 mm (t1) and 1.6 mm (t2) respectively, and the porous pipe with dimensions illustrate in FIG. 5 (40 mm×40 mm×8.08 mm, the material being a A6063 alloy) were brazed as in the example 2 at three kinds of loads of 350 N (a partition plate surface pressure of 2.3 MPa), 850 N (a partition plate surface pressure of 5.7 MPa), and 1100 N (a partition plate surface pressure of 7.4 MPa). The materials of the metal circuit board 15 and the metal base plate 20 were 0.4 mass % Si-0.04 mass % B-balance Al.

Figure 17:
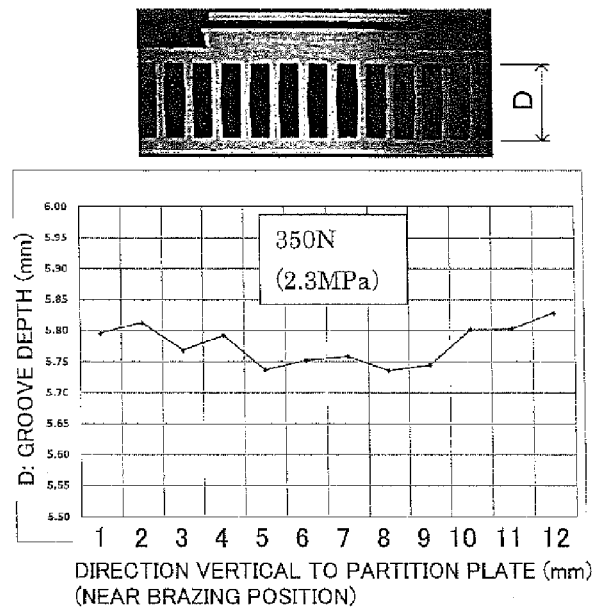
FIG. 17 Graphs showing the deformation state of the partition plate and the distribution of the groove depth at each surface pressure obtained in the example 5, specifically in FIG. 17(a) at 350 N, FIG. 17(b) at 850 N, and FIG. 17(c) at 1100 N.
Figure 17:
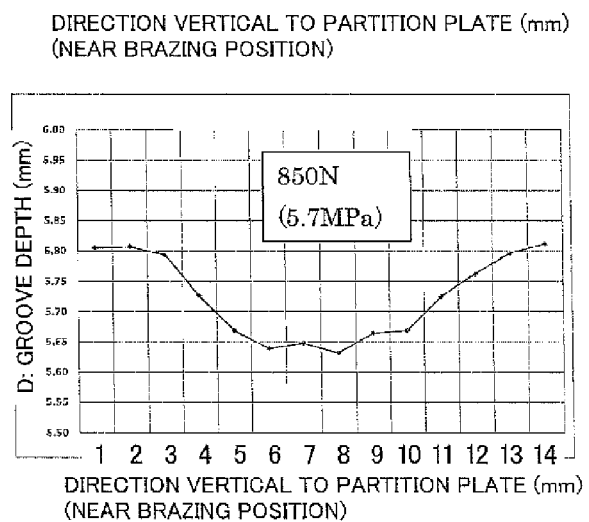
Figure 17:
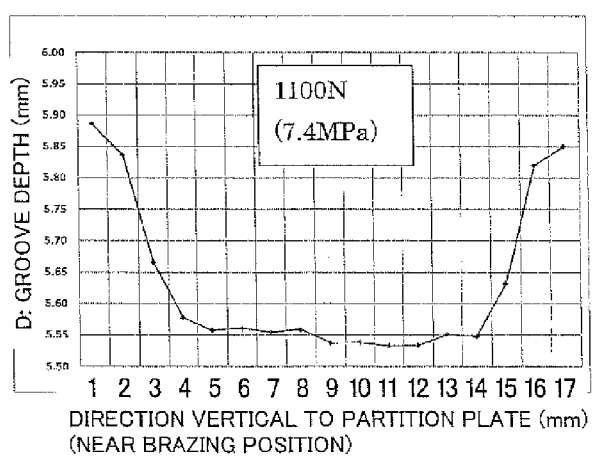

The groove depth and the deformation state of the partition plate after the brazing are presented in FIG. 17(*a*), FIG. 17(*b*) and FIG. 17(*c*). At a surface pressure of 7.4 MPa in FIG. 17(*c*), the partition plate was greatly deformed (buckled) and the groove depth decreased by 0.3 mm. At a surface pressure of 5.7 MPa in FIG. 17(*b*), the deformation of the partition plate became small and the groove depth decreased by 0.15 mm. At a surface pressure of 2.3 MPa in FIG. 17(*a*), the deformation of the partition plate became extremely small and there was no change in the groove depth. In the state at the surface pressure of 7.3 MPa, the flow of the cooling water became unstable and the thermal performance slightly decreased but was within the allowable range. The limit surface pressure changes depending on the whole height. When a partition plate height D' changed by 10% from the height D (partition plate height, groove depth) before bonding, the thermal performance decreased to a degree to affect the cooling when a semiconductor chip was mounted on the metal circuit board, and therefore regarding the degree as an index, the groove width with which the deformation amount of the partition plate was 10% or less was decided. The result is presented in FIG. 18. The width of the partition plate at that time was made constant at 1.0 mm Since the number of partition plates increases as the groove width decreases, the load with which the partition plate is deformed by 10% (limit load) increases as the groove width decreases as is clear from FIG. 18. Further, as the height of the porous pipe increases, the limit load decreases.

Figure 18:
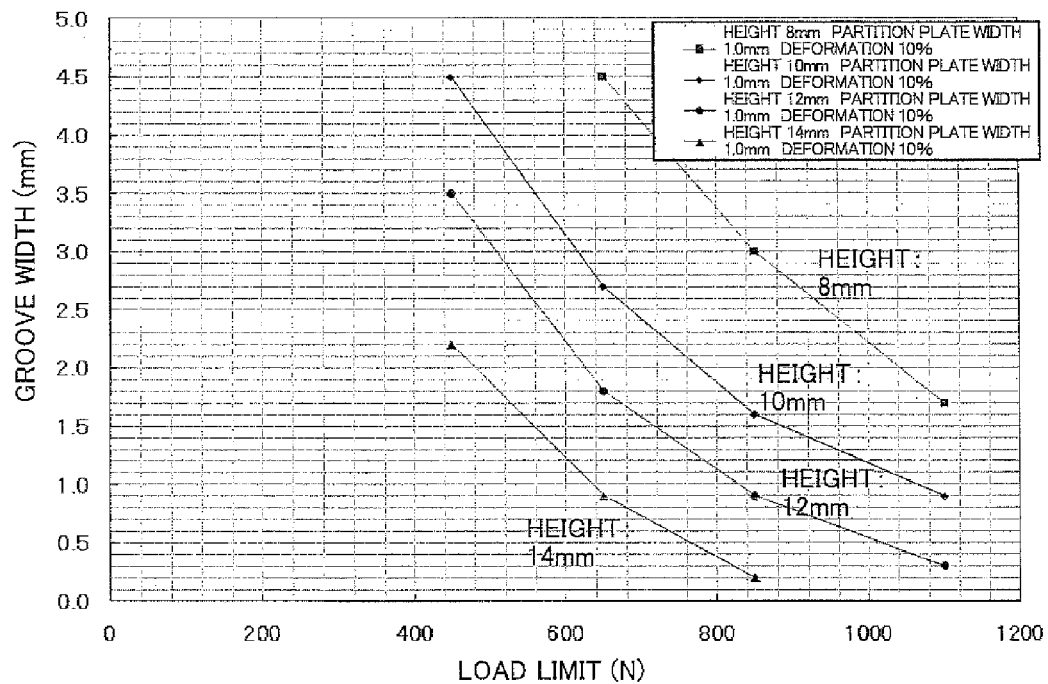
FIG. 18 A graph showing the relation between the limit load and the groove width obtained in the example 5.
Figure 19:
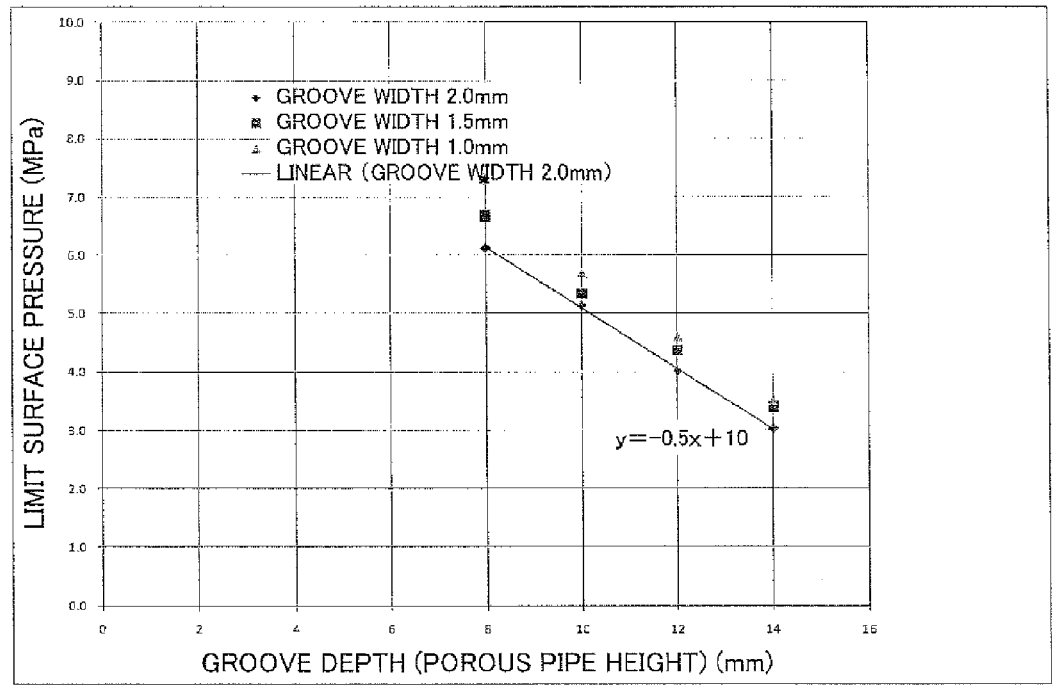
FIG. 19 A graph showing the relation between the height of the porous pipe (groove depth) and the limit surface pressure obtained in the example 5.

The limit load at each groove width was obtained from the result in FIG. 18, and a value obtained by dividing the load by the partition plate area was set as the limit surface pressure (MPa). As illustrated in FIG. 19, the limit surface pressure is in a good correlation with respect to the whole height of the porous pipe. Further, since the limit surface pressure decreased as the groove width increased, the limit surface pressure was decided at a small groove width of 1.0 mm.

The limit surface pressure without decrease in thermal performance is calculated by −0.5×D (groove depth, partition plate height)+10, and by setting a surface pressure lower than the calculated value, a cooler without deformation of the partition plate can be obtained. When applying the surface pressure equal to or larger than the calculated value, the buckling of the partition plate further increases to increase the change in groove width W1, and therefore the surface pressure of the partition plate was set to be equal to or less than −0.5×D (groove depth, partition plate height)+10 (MPa). On the other hand, in the case of the large heat radiating substrate, there was no deformation of the partition plate at a load of 1100 N (a surface pressure of 4.1 MPa). Note that the buckling of the partition plate can be considered to provide an effect to decrease the warpage amount of the metal circuit board, and therefore may be positively utilized as long as the deformation amount is within 10% providing no decrease in thermal performance as described above.

INDUSTRIAL APPLICABILITY

The present invention is applied to a metal-ceramic bonded substrate and, in particular, to a liquid-cooled integrated substrate in which a metal circuit board and a metal base plate each made of aluminum or an aluminum alloy are bonded to both surfaces of a ceramic substrate respectively, and a radiator is bonded to a surface of the metal base plate where the ceramic substrate is not bonded, and a manufacturing method thereof.

TABLE 1

| | CERAMIC SUBSTRATE (ALUMINUM NITRIDE SUBSTRATE) | | | METAL CIRCUIT BOARD (ALUMINUM) | | | METAL BASE PLATE (ALUMINUM) | | | BONDING METHOD | |
|---|---|---|---|---|---|---|---|---|---|---|---|
| | HEIGHT (mm) | WIDTH (mm) | THICK-NESS (mm) | HEIGHT (mm) | WIDTH (mm) | THICK-NESS (mm) | HEIGHT (mm) | WIDTH (mm) | THICK-NESS (mm) | CERAMIC SUBSTRATE AND ALUMINUM | METAL BASE PLATE AND RADIATOR |
| PRESENT INVENTION EXAMPLE 1 | 28.8 | 18.1 | 0.6 | 26.8 | 16.1 | 0.6 | 26.8 | 16.1 | 1.6 | MOLTEN METAL BONDING | BRAZING |
| PRESENT INVENTION EXAMPLE 2 | 33.8 | 28.8 | 0.6 | 31.8 | 26.8 | 0.6 | 31.8 | 26.8 | 1.6 | MOLTEN METAL BONDING | BRAZING |
| PRESENT INVENTION EXAMPLE 3 | 28.8 | 18.1 | 0.6 | 26.8 | 16.1 | 0.7 | 26.8 | 16.1 | 3.0 | MOLTEN METAL BONDING | BRAZING |
| COMPARATIVE EXAMPLE 1 | 28.8 | 18.1 | 0.6 | 26.8 | 16.1 | 0.6 | 26.8 | 16.1 | 0.6 | MOLTEN METAL BONDING | BRAZING |
| COMPARATIVE EXAMPLE 2 | 28.8 | 18.1 | 0.6 | 26.8 | 16.1 | 1.1 | 26.8 | 16.1 | 1.1 | MOLTEN METAL BONDING | BRAZING |

TABLE 2

| | SOLDER CRACK AREA RATIO (%) | | | | CRACK AT BONDING INTERFACE AFTER 4000 CYCLES OF HEAT SHOCK TEST | | WARPED SHAPE OF POROUS PIPE (μm) | | | |
|---|---|---|---|---|---|---|---|---|---|---|
| | | | | | BETWEEN CERAMIC SUBSTRATE AND METAL BASE PLATE | BETWEEN METAL BASE PLATE AND RADIATOR | ① AFTER BONDING | ② AFTER SOLDERING | ③ AFTER 4000 CYCLES | ①-③ |
| | INITIAL STAGE | 1000 CYCLE | 2500 CYCLE | 4000 CYCLE | | | | | | |
| PRESENT INVENTION EXAMPLE 1 | 0 | 0.5 | 1.5 | 1.5 | NOT OBSERVED | SMALL (LESS THAN 1 mm) | 51 | 40 | 39 | 12 |
| PRESENT INVENTION EXAMPLE 2 | 0 | 0.5 | 5.5 | 6.2 | NOT OBSERVED | SMALL (LESS THAN 1 mm) | 140 | 159 | 175 | −35 |
| PRESENT INVENTION EXAMPLE 3 | 0 | 2.5 | — | — | — | — | 71 | — | — | — |

TABLE 2-continued

| | SOLDER CRACK AREA RATIO (%) | | | | CRACK AT BONDING INTERFACE AFTER 4000 CYCLES OF HEAT SHOCK TEST | | WARPED SHAPE OF POROUS PIPE (μm) | | | |
|---|---|---|---|---|---|---|---|---|---|---|
| | | | | | BETWEEN CERAMIC SUBSTRATE AND METAL BASE PLATE | BETWEEN METAL BASE PLATE AND RADIATOR | ① AFTER BONDING | ② AFTER SOLDERING | ③ AFTER 4000 CYCLES | ①-③ |
| | INITIAL STAGE | 1000 CYCLE | 2500 CYCLE | 4000 CYCLE | | | | | | |
| COMPARATIVE EXAMPLE 1 | 0 | 4.8 | 10.5 | 15 | OBSERVED (ABOUT 3 mm) | LARGE (4 mm OR MORE) | 37 | 41 | 39 | −2 |
| COMPARATIVE EXAMPLE 2 | 0 | 25 | — | — | — | — | 40 | — | — | — |

TABLE 3

| RADIATOR | SECOND MOMENT OF AREA OF RADIATOR (mm⁴) | WARPAGE AMOUNT (μm) | | | | | | t1/t2 LOAD SURFACE PRESSURE |
|---|---|---|---|---|---|---|---|---|
| | | 0.6 mm/1.6 mm | | | | | 0.6 mm/0.6 mm | |
| | | 1100N 2.65 | 850N 2.05 | 600N 1.45 | 350N 0.84 | 100N 0.24 | 850N 2.05 | |
| 4 mm THICK Al PLATE | 84 | 42 | 49 | 63 | 73 | 81 | 51 | |
| 6 mm THICK Al PLATE | 283 | 35 | 43 | 54 | 63 | 69 | 40 | |
| 8 mm THICK Al PLATE | 446 | 29 | 38 | 42 | 56 | 65 | 29 | |
| POROUS PIPE | 679 | 25 | 33 | 38 | 52 | 62 | 19 | |

The invention claimed is:

1. A liquid-cooled integrated substrate in which a metal circuit board made of aluminum or an aluminum alloy is bonded to one surface of a ceramic substrate, one flat surface of a plate-like metal base plate made of aluminum or an aluminum alloy is bonded to another surface of the ceramic substrate, and a liquid-cooling type radiator composed of an extrusion material with flow paths for a coolant integrally formed by extrusion processing is bonded to another flat surface of the plate-like metal base plate by brazing, wherein a brazing material layer is formed in a gap part between the liquid-cooling type radiator and the another flat surface of the plate-like metal base plate, wherein a relation between a thickness t1 of the metal circuit board and a thickness t2 of the plate-like metal base plate satisfies a following expression (1)

$$t2/t1 \geq 2 \quad (1)$$

where the thickness t1 of the metal circuit board is 0.4 to 3 mm and the thickness t2 of the plate-like metal base plate is 0.8 to 6 mm, wherein the radiator has a hollow inner space that is partitioned by partition plates into the flow paths for the coolant, wherein a relation between a width W (mm) of a flow path and a depth D (mm) of the flow path satisfies 3.3W<D<10W, and wherein a relation between the width W (mm) of the flow path and a width T (mm) of a partition plate satisfies $$-W+1.4<T/W<-1.5W+3.3 \text{ (when } 0.4 \leq W \leq 1.0\text{)}$$

$$-0.2W+0.7<T/W<-1.5W+3.3 \text{ (when } 1.0<W<2.0\text{)}.$$

2. The liquid-cooled integrated substrate according to claim 1,
wherein the width W of the flow path is 0.4 mm or more.

3. The liquid-cooled integrated substrate according to claim 1,
wherein the radiator is made of aluminum or an aluminum alloy having a heat conductivity of 170 W/mK or more.

4. The liquid-cooled integrated substrate according to claim 1,
wherein the metal base plate is made of aluminum or an aluminum alloy having a heat conductivity of 170 W/mK or more.

5. The liquid-cooled integrated substrate according to claim 1,
wherein the metal circuit board is made of aluminum or an aluminum alloy having a heat conductivity of 170 W/mK or more.

6. The liquid-cooled integrated substrate according to claim 1,
wherein bonding of the ceramic substrate and the metal circuit board and bonding of the ceramic substrate and the metal base plate are performed by a molten metal bonding method.

7. The liquid-cooled integrated substrate according to claim 1,
wherein a partition plate of the radiator is buckled.

8. A liquid-cooled integrated substrate in which a metal circuit board made of aluminum or an aluminum alloy is bonded to one surface of a ceramic substrate, one flat surface of a plate-like metal base plate made of aluminum or an aluminum alloy is bonded to another surface of the ceramic substrate, and a liquid-cooling type radiator composed of an extrusion material with flow paths for a coolant integrally formed by extrusion processing is bonded to another flat surface of the plate-like metal base plate, wherein a brazing material layer is formed in a gap part between the liquid-cooling type radiator and the another flat surface of the plate-like metal base plate, wherein the radiator has a hollow inner space that is partitioned by partition plates into the flow paths for the coolant, wherein a relation between a width W (mm) of a flow path and a depth D (mm) of the flow path satisfies $3.3W<D<10W$, and wherein a relation between the width W (mm) of the flow path and a width T (mm) of a partition plate satisfies $-W+1.4<T/W<-1.5W+3.3$ (when $0.4 \leq W \leq 1.0$)

$-0.2W+0.7<T/W<-1.5W+3.3$ (when $1.0<W<2.0$).

* * * * *